(12) United States Patent
Srivastava et al.

(10) Patent No.: US 10,333,502 B1
(45) Date of Patent: Jun. 25, 2019

(54) LEVEL SHIFTER WITH SUB-THRESHOLD VOLTAGE FUNCTIONALITY

(71) Applicant: Cadence Design Systems, Inc., San Jose, CA (US)

(72) Inventors: Abhinav Srivastava, Lucknow (IN); Vinod Kumar, Pratapgarh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/936,217

(22) Filed: Mar. 26, 2018

(51) Int. Cl.
*H03K 3/00* (2006.01)
*H03K 3/356* (2006.01)

(52) U.S. Cl.
CPC .............................. *H03K 3/356113* (2013.01)

(58) Field of Classification Search
CPC ... H03K 19/018521; H03K 19/018528; H03K 3/356113; H03K 19/00315; H03K 19/00361; H04L 25/028; H04L 25/0272; G11C 8/08; G11C 5/145; G11C 7/12
See application file for complete search history.

(56) References Cited

U.S. PATENT DOCUMENTS

| | | | |
|---|---|---|---|
| 7,446,566 B1 * | 11/2008 | Chrudimsky | H03K 3/012 326/68 |
| 2009/0033401 A1 * | 2/2009 | Kossel | H03K 3/35613 327/333 |
| 2016/0118985 A1 * | 4/2016 | Zhou | H03K 3/356165 326/80 |

* cited by examiner

*Primary Examiner* — Long Nguyen
(74) *Attorney, Agent, or Firm* — Schwegman Lundberg & Woessner, P.A.

(57) ABSTRACT

Various embodiments provide for a level shifter with sub-threshold voltage functionality, which permits the level shifter to operate even when a voltage supply to the level shifter falls below a normal operational voltage range of one or more devices (e.g., transistors) within the level shifter. A level shift of an embodiment may operate when a voltage supply falls below a normal operational range in order to save power, which can be useful with respect to battery-operated devices, such an Internet of Things (IoT) sensor.

16 Claims, 8 Drawing Sheets

LEVEL SHIFTER WITH SUB-THRESHOLD VOLTAGE FUNCTIONALITY

TECHNICAL FIELD

Embodiments described herein relate to level shifters and, more particularly, to systems, methods, and devices that provide level shifters with sub-threshold voltage functionality.

BACKGROUND

A level shifter comprises one or more electrical circuits that receives an input signal having a first voltage level and converts (e.g., shifts) the input signal such that the level shift produces an output signal, based on the input signal, that has a second voltage level different (e.g., higher) than the first voltage level. Typically, level shifters are used in the context of data input/output (I/O), where, for example, a level shifter can be used to address the voltage difference between a core voltage supply (e.g., VDD, such as a voltage supply for core logic or an input buffer of a processor), such as a voltage supply used within a processor, and I/O supply (e.g., VDDQ, such voltage supply provided by an output buffer of a processor) that powers I/O circuitry and interfaces, such as the I/O of the processor. Additionally, in the context of I/O usage, a level shifter may need to operate at a fast rate and provide a wide supply range to facilitate high I/O data rates.

With more and more usage of battery-operated systems, such as Internet-of-Things (IoT) sensors, the ability of such systems to conserve their battery power has become a priority. One way of conserving power (e.g., battery power) is to lower the voltage of a core voltage supply of a circuit (e.g., a processor) of a system. Unfortunately, in some instances, lowering the voltage of the core voltage supply can cause the core voltage supply to fall below the normal operational range of devices (e.g., transistors) used within a conventional level shifter, thereby preventing the conventional level shifter from operating properly.

BRIEF DESCRIPTION OF THE DRAWINGS

Various ones of the appended drawings merely illustrate example embodiments of the present disclosure and should not be considered as limiting its scope.

DETAILED DESCRIPTION

Various embodiments provide for a level shifter with sub-threshold voltage functionality, which permits the level shifter to operate even when a voltage supply (e.g., core voltage supply, which may be represented as VDD hereafter) to the level shifter falls below a normal operational voltage range (e.g., falls below the threshold voltage) of one or more devices (e.g., transistors) within the level shifter. A level shift of an embodiment may operate when a voltage supply (e.g., VDD) falls below a normal operational range in order to save power, which can be useful with respect to a battery-operated device, such as an IoT sensor.

A level shifter described herein may be used in an electronic system (e.g., IoT sensor) where, to lower or conserve power, a voltage supply to the level shifter (e.g., core voltage supply) is lowered to a level below the normal operational range of one or more devices within the level shifter. As used herein, a level shifter of an embodiment may be referred to as operating in a normal operating mode when a voltage supply (e.g., the core voltage supply) to the level shifter is within a normal operational range (e.g., at or above the threshold voltage) of device(s) (e.g., transistors) within the level shifter. Additionally, a level shifter of an embodiment may be referred to as operating in a deep-sleep operating mode when a voltage supply (e.g., the core voltage supply) powering the level shifter falls below a normal operational range (e.g., threshold voltage) of at least one device (e.g., transistor) of the level shifter.

The level shifter of some embodiments operates at high speed and can accommodate wide core voltage supply variation (e.g., 0.66V to 0.88V) and I/O voltage supply variation (e.g., 1.08V to 1.98V), which may be useful for certain types of I/O buffers (e.g., ONFI, e-MMC, xPHI I/O buffers). While operating in deep-sleep operating mode, a level shifter may be capable of detecting a voltage supply signal (e.g., core voltage supply signal) when the voltage supply signal is in sub-threshold voltage range of one or more devices of the level shifter. The level shifter may generate a set of well-defined logic states while operating in deep-sleep operating mode. For example, a level shifter of an embodiment may be used with 16 nm Fin Field Effect Transistor (FinFET) technology (e.g., 16 nm FinFET), where during deep-sleep, the level shifter may operate with a voltage supply (e.g., core voltage supply as low as 475 mV, which may be 0.6 times lower than that of an operating core voltage supply of 800 mV with I/O supply as high as 1.98V). Additionally, the level shifter of an embodiment may operate with a data rate of 2 Gbps or higher when the level shifter is operating in normal operating mode. For instance, the level shifter of some embodiments delivers high performance (e.g., DCD+/−2% at 2 Gbps), provides large variation in I/O voltage supply (e.g., 1.08V to 1.98V), and can operate within a large variation in core supply (e.g., 0.66V to 0.88V).

Figure 1:
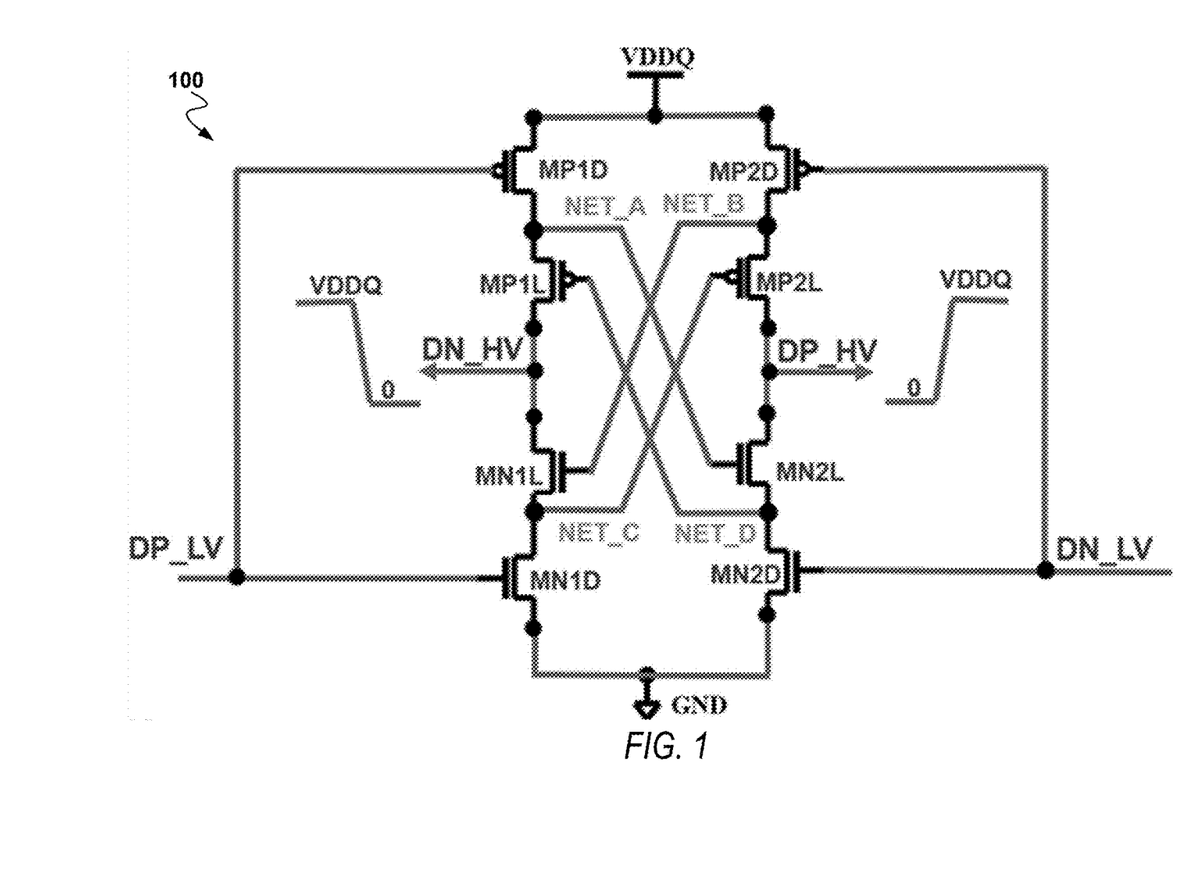
FIG. 1 is a schematic illustrating an example level shifter circuit, in accordance with some embodiments.

FIG. 1 is a schematic illustrating an example level shifter circuit 100, in accordance with some embodiments. As shown, the level shifter circuit 100 comprises P-type metal-oxide-semiconductor (PMOS) transistors MP1D, MP1L, MP2D, and MP2L, and N-type metal-oxide-semiconductor (NMOS) transistors MN1L, MN1D, MN2L, and MN2D. MP1D is coupled between a voltage supply node VDDQ (e.g., voltage rail), which may be powered by a non-core voltage supply such as one that powers I/O circuitry/interfaces, and a cross-branch node NET_A. MP1L is coupled between the node NET_A and an output node DN_HV. MN1L is coupled between the node DN_HV and a cross-branch node NET_C. MN1D is coupled between the node NET_C and a ground node GND (e.g., ground rail). MP2D is coupled between the node VDDQ and a cross-branch node NET_B. MP2L is coupled between the node NET_B and an output node DP_HV. MN2L is coupled between the node DP_HV and a cross-branch node NET_D. MN2D is coupled between the node NET_D and the ground node GND (e.g., ground rail). According to some embodiments, MP1D, MP1L, MN1L, and MN1D implements a first arrangement (e.g., series) of transistors, and MP2D, MP2L, MN2L, and MN2D implements a second arrangement (e.g., series) of transistors of a level shifter circuit, where the first arrangement is arranged in parallel to the second arrangement.

As also shown, an input node DP_LV is coupled to a gate of MP1D and to a gate of MN1D, and an input node DN_LV is coupled to a gate of MP2D and to a gate of MN2D. For some embodiments, the node DP_LV provides a first input signal (e.g., core voltage input signal) to MP1D and MN1D, and the node DN_LV provides a second, complimentary input signal to MP2D and MN2D. For example, according to some embodiments, the second input signal comprises a logical compliment of the first input signal. For instance, where the first input signal is at logic 'Low', the second input signal may be at logical compliment of the first voltage level (i.e. logic 'High').

Additionally, for some embodiments, the input signal provided by the input node DP_LV is powered by a voltage supply, at voltage level VDD, that is different from the voltage supply providing power to the voltage supply node VDDQ. For example, the voltage supply providing VDD may comprise a core voltage supply. Depending on the embodiment, the voltage supply providing VDD is smaller in comparison to the voltage supply powering the voltage supply node VDDQ.

According to some embodiments, MP1D and MP2D provide a strong 'ON' state and a weak 'OFF' state with respect to the voltage level VDD powering the input node DP_LV. According to some embodiments, during sub-threshold operation (e.g., deep-sleep operating mode) of the level shifter circuit 100, MN1D and MN2D provide a weak 'ON' state and a strong 'OFF' state with respect to the voltage level VDD powering the input node DP_LV. For some embodiments, when the level shifter circuit 100 is not in sub-threshold operation (e.g., not in deep-sleep operating mode), the MN1D and MN2D provide a strong 'ON' state and a strong 'OFF' state with respect to the voltage level VDD powering the input node DP_LV.

During operation, MP1D can drive MN2L by the cross-branch node NET_A, which in turn can drive and enable MN2L to produce (e.g., enter) a strong 'ON' state or a strong 'OFF' state. Likewise, MP2D can drive MN1L by the cross-branch node NET_B, which in turn can drive and enable MN1L to produce a strong 'ON' state or a strong 'OFF' state. MN1D can drive the MP2L by cross-branch node NET_C, which in turn can drive MP2L to produce a strong 'ON' state or a strong 'OFF' state. Likewise, MN2D can drive the MP1L by cross-branch node NET_D, which in turn can drive MP1L to produce a strong 'ON' state or a strong 'OFF' state.

According to some embodiments, the cross-branch nodes (e.g., NET_A, NET_B, NET_C, and NET_D) operate as a feedback within the level shifter circuit 100 to control cross branch current driving capacity. Additionally, the combination of MP1L, MN1L, MP2L and MN2L can work as feed-forward controlled latches, which in turn assist in achieving static logic 'High' and logic 'Low' faster within the level shifter circuit 100 by helping to control cross branch diagonal current driving capacity.

Figure 2:
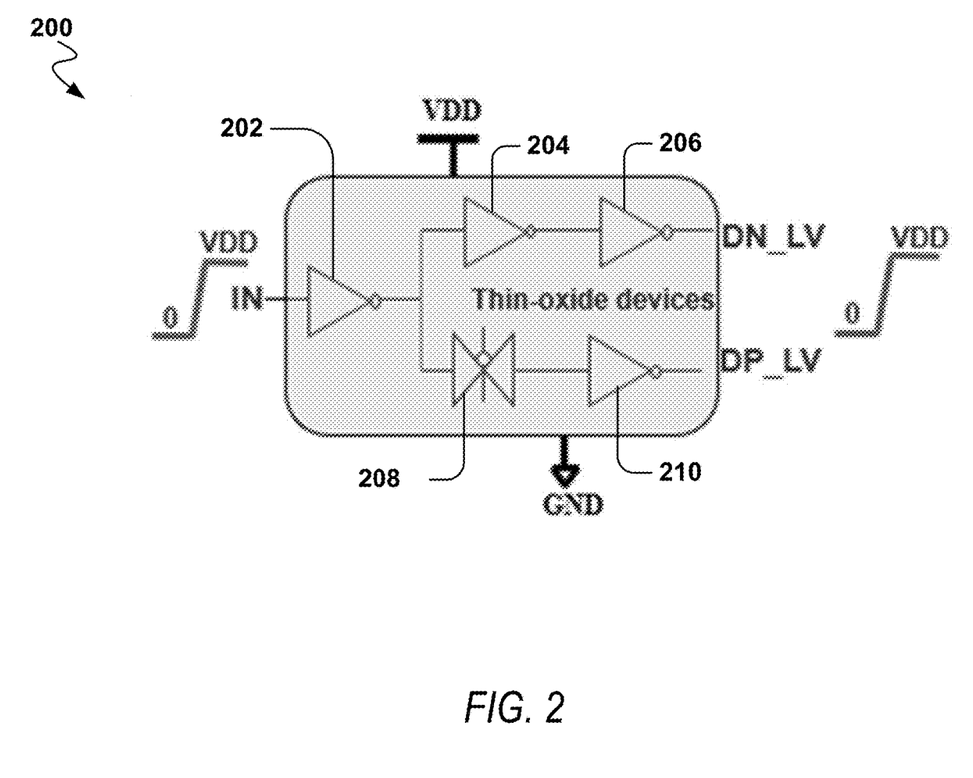
FIG. 2 is a schematic illustrating an example splitter circuit for providing one or more input signals for a level shifter, in accordance with some embodiments.

FIG. 2 is a schematic illustrating an example splitter circuit 200 for providing one or more input signals for a level shifter, in accordance with some embodiments. For example, the splitter circuit 200 can provide an input signal to the node DP_LV of the level shifter circuit 100 described with respect to FIG. 1, and can provide the compliment of the input signal to the node DN_LV of the level shifter circuit 100 described with respect to FIG. 1 based on an input signal IN. As shown, the splitter circuit 200 comprises inverters 202, 204, 206, 210 and a transmission gate 208, each of which may be a thin-oxide device. The inverter 202 receives an input signal IN and splits its output to both the inverter 204 and the transmission gate 208. As also shown, the splitter circuit 200 is powered by VDD, which may represent the core voltage supply.

The inverter 204 receives the output signal of the inverter 202 and outputs a signal to the inverter 206. The transmission gate 208 receives the output signal of the inverter 202 and outputs a signal to the inverter 210. The output of inverter 206 provides the input signal to the node DP_LV and the output of the inverter 210 provides the input signal to the node DN_LV.

Figure 3:
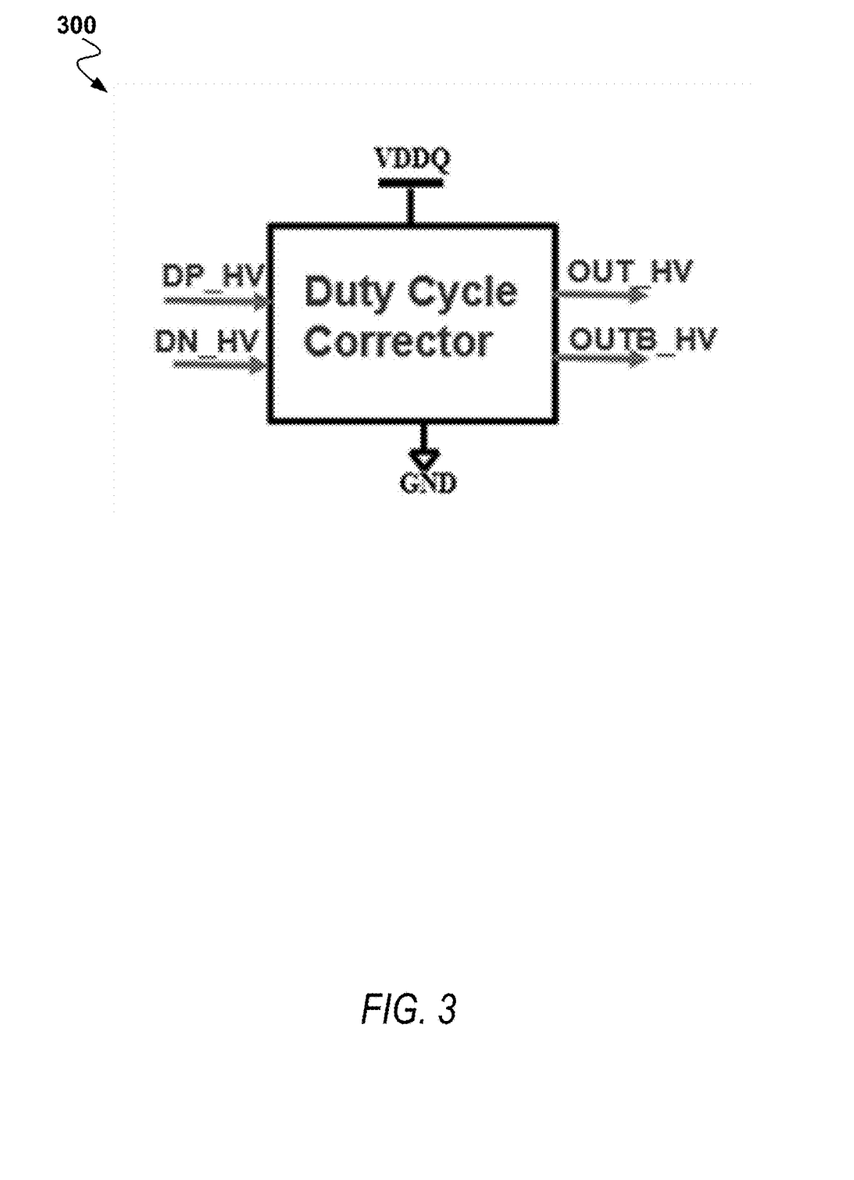
FIG. 3 is a block diagram illustrating an example duty cycle corrector that operates with an example level shifter, in accordance with some embodiments.

FIG. 3 is a block diagram illustrating an example duty cycle corrector 300 that operates with an example level shifter, in accordance with some embodiments. For some embodiments, the duty cycle corrector 300 corrects duty cycle distortion for the output signals provided by the level shifter circuit 100 via the nodes DP_HV and DN_HV. As shown, the duty cycle corrector 300 receives an input signal via the node DP_HV and outputs a signal to node OUT_HV representing the DP_HV signal with duty cycle distortion correction. Likewise, the duty cycle corrector 300 receives an input signal via the node DN_HV and outputs a signal to node OUTB_HV representing the DN_HV signal with duty cycle distortion correction. For some embodiments, the duty cycle corrector 300 is powered by VDDQ, which can represent a voltage supply other than a core voltage supply, such as an I/O interfaces power supply.

FIGS. 4-7 are schematics illustrating operation of the level shifter circuit 100, in accordance with some embodiments. In particular, each of the FIGS. 4-7 illustrates the level shifter circuit 100 during different states of its operation.

Figure 4:
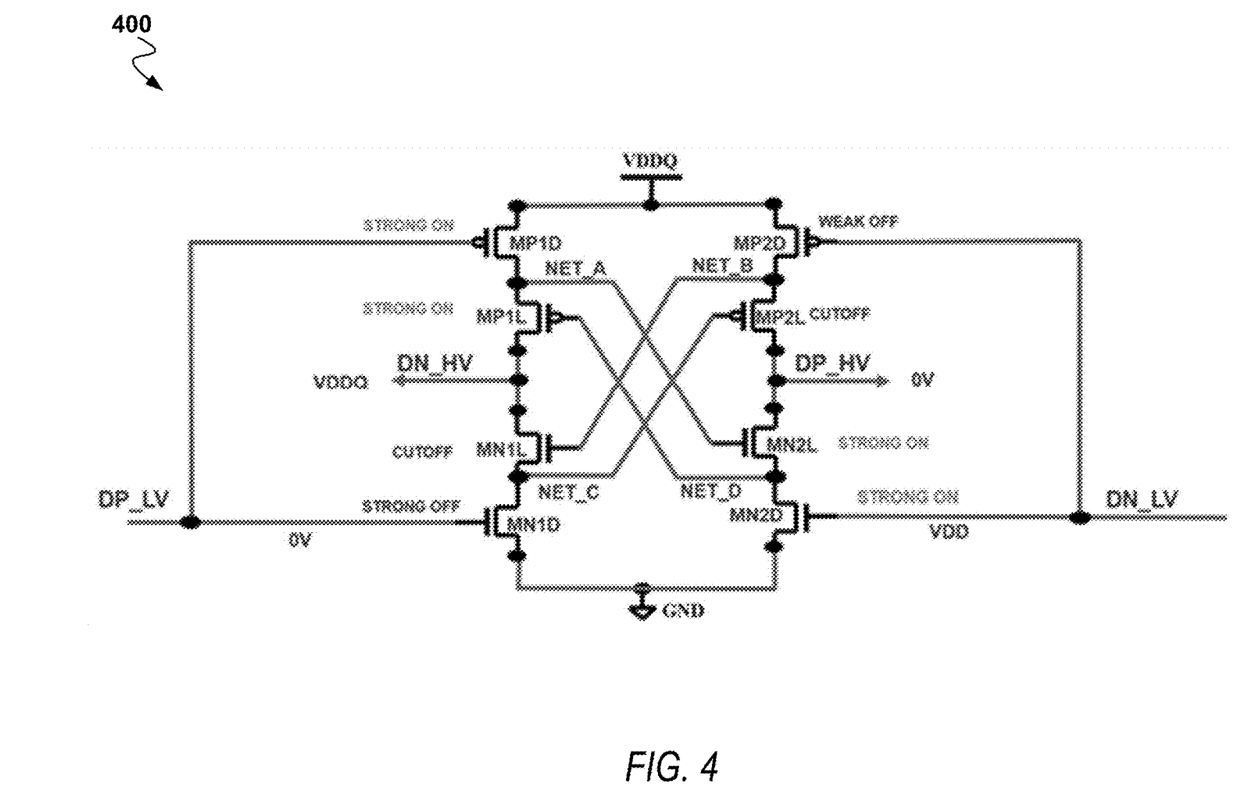
FIGS. 4-7 are schematics illustrating operation of an example level shifter circuit, in accordance with some embodiments.

Referring now to FIG. 4, according to some embodiments, FIG. 4 illustrates the level shifter circuit 100 during a logic low input state (i.e. IN=0V). As input to the level shifter circuit 100, the node DP_LV of the level shifter circuit 100 receives a logic low voltage (voltage level of 0V) and the node DN_LV receives a logic high voltage (voltage of VDD). The nodes DP_LV and DN_LV receive these signals based on the splitter circuit 200 receiving the input signal IN comprising a logic low voltage (voltage level of 0V). As output to the level shifter circuit 100, the node DN_HV is at a logic high voltage (voltage level of VDDQ) and the node DP_HV is at a logic low voltage (voltage level of 0V).

During the state of operation illustrated by FIG. 4, MP1D is in a strong 'ON' state and MN1D is in a strong 'OFF' state based on the gate of MP1D and the gate of MN1D are connected to a ground node GND (voltage level of 0V). At the same time, MP2D and MN2D are connected to the node DN_LV, which is at a voltage level of VDD. MP2D is in a weak 'OFF' state and MN2D is in a strong 'ON' state based on the node DN_LV being at a voltage level of VDD.

With respect to the cross branches in FIG. 4, the nodes NET_A, NET_B and NET_C attain a voltage level of VDDQ, and NET_D attains a logic low voltage (voltage level of 0V). This results in a strong turning 'ON' state for MP1L and a cut-off state for MN1L (based on both the nodes NET_C and NET_B attaining a voltage level of VDDQ) in the branch driving the node DN_HV, which drives the node DN_HV to a logic high voltage at a voltage level of VDDQ. Additionally, the cross branch from the node NET_C to the gate of MP2L is cut off (based on both the nodes NET_C and NET_B attaining a voltage of VDDQ) and MN2L is in a strong 'ON' state in the branch that drives the node DP_HV, which results in the node DP_HV attaining a logic low voltage (voltage level of 0V).

Figure 5:
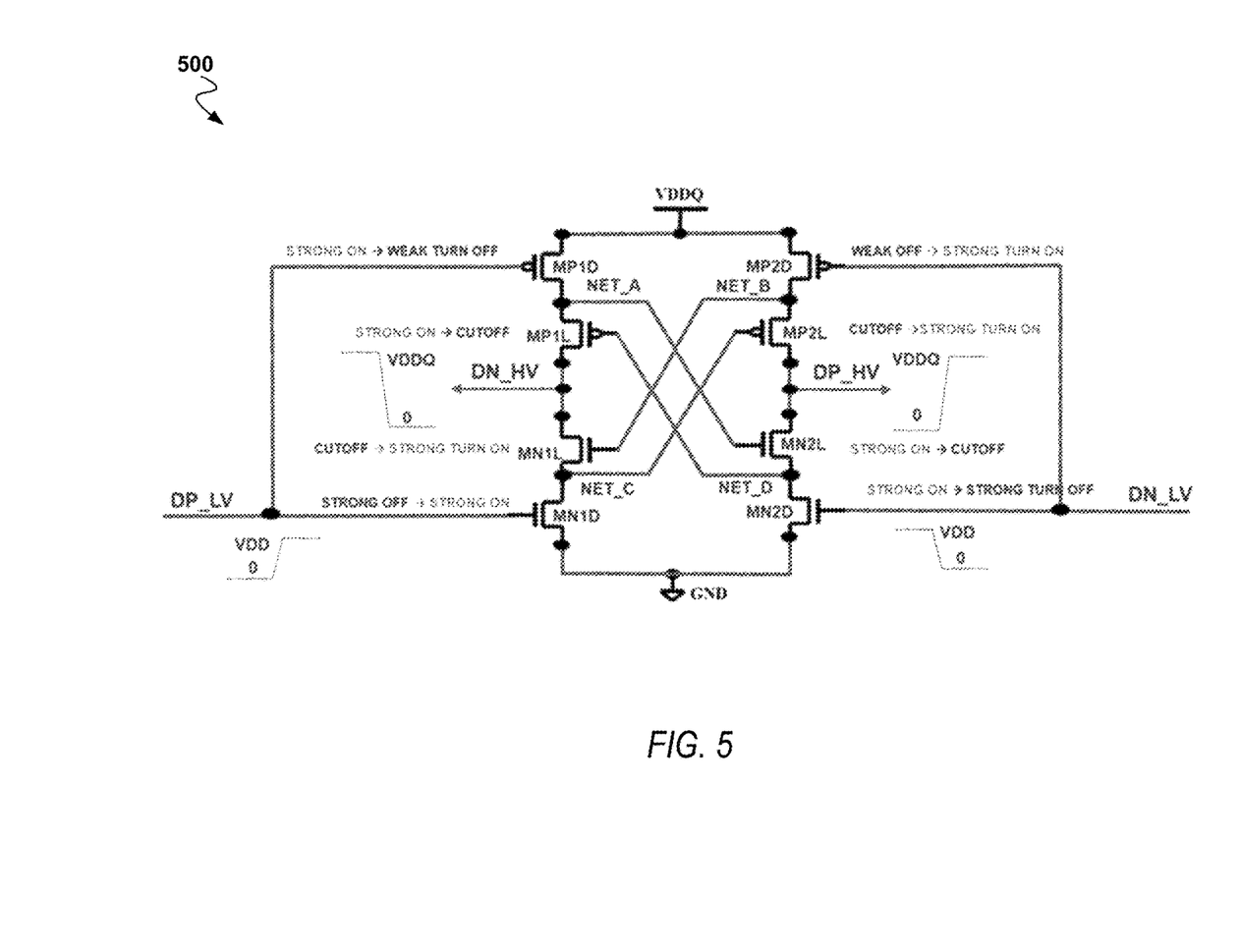

Referring now to FIG. 5, according to some embodiments, FIG. 5 illustrates the level shifter circuit 100 transitioning from a logic low input state (e.g., IN=0V) to logic high input state (e.g., IN=VDD). As input to the level shifter circuit 100, the node DP_LV of the level shifter circuit 100 switches from a logic low voltage (voltage level of 0V) to a logic high voltage (voltage level of VDD), and the node DN_LV switches from a logic high voltage (voltage of VDD) to a logic low voltage (voltage level of 0V). The nodes DP_LV and DN_LV receive these signals based on the input signal IN of the splitter circuit 200 switching from a logic low voltage (voltage level of 0V) to a logic high voltage (voltage level of VDD). As output to the level shifter circuit 100, the node DN_HV switches from a logic high voltage (voltage level of VDDQ) to a logic low voltage (voltage level of 0V), and the node DP_HV switches from a logic low voltage (voltage level of 0V) to a logic high voltage (voltage level of VDDQ).

During the state of operation illustrated by FIG. 5, MP1D switches from a strong 'ON' state to a weak 'OFF' state and MN1D switches from a strong 'OFF' state to a strong 'ON' state based on the node DP_LV switching from a logic low voltage (voltage level of 0V) to a logic high level signal (voltage level of VDD). MN2D switches from a strong 'ON' state to a strong 'OFF' state and MP2D switches from a weak 'OFF' state to a strong 'ON' state based on the node DN_LV switching from a logic high voltage (voltage level of VDD) to a logic low voltage (voltage level of 0V).

At the same time, MP2D and MN2D are connected to the node DN_LV, which is at a voltage level of VDD. MP2D is in a weak 'OFF' state and MN2D is in a strong 'ON' state based on the node DN_LV being at a voltage level of VDD. Since MN1L is cut off initially, the node NET_C will fall quickly and this, in turn, would cause MP2L to switch from a cut-off state to a strong 'ON' state. Based on both MP2D and MP2L entering a strong 'ON' state and MN2D entering a strong 'OFF' state, the node DP_HV switches from a logic low voltage (voltage level of 0V) to a logic high voltage (voltage level of VDDQ). Additionally, the gate voltage of MN2L (via the node NET_A) is at a voltage level of VDDQ, which causes the cross branch from the node NET_D to the gate of MP1L to attain a voltage level of VDDQ and causes MP1L to enter a cut-off state. The strong 'ON' state of MP2D pulls the cross branch from the node NET_B to the gate of MN1L to a voltage level of VDDQ, which in turn causes MN1L to enter the strong 'ON' state. Since both MN1D and MN1L enter the strong 'ON' state and MP1L enters the strong 'OFF' state, the node DN_HV switches from a logic high voltage (voltage level of VDDQ) to a logic low voltage (voltage level of 0V).

Figure 6:
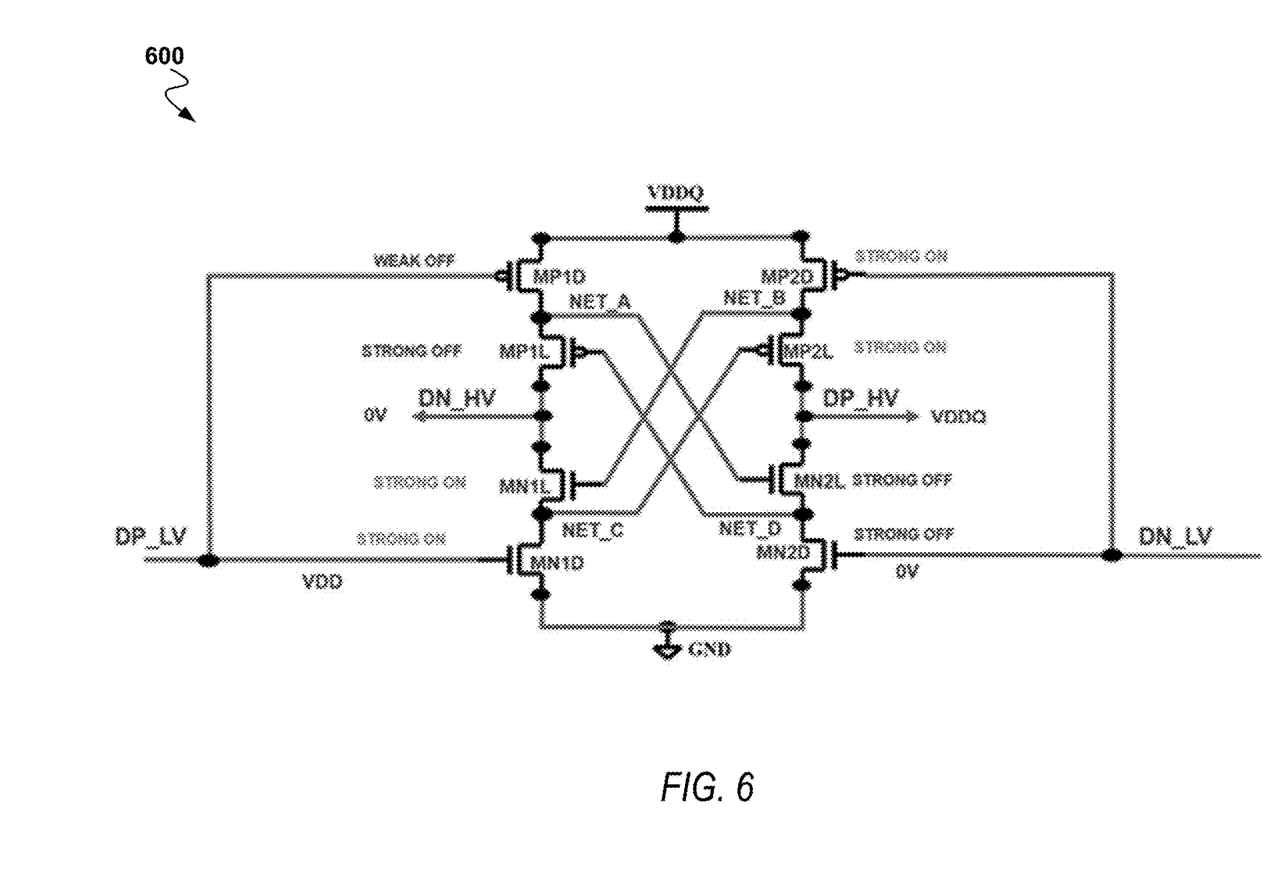

Referring now to FIG. 6, according to some embodiments, FIG. 6 illustrates the level shifter circuit 100 in logic high input state (e.g., IN=VDD). As input to the level shifter circuit 100, the node DP_LV of the level shifter circuit 100 receives a logic high voltage (voltage of VDD) and the node DN_LV receives a logic low voltage (voltage level of 0V). The nodes DP_LV and DN_LV receive these signals based on the splitter circuit 200 receiving the input signal IN comprising a logic high voltage (voltage level of VDD). As output to the level shifter circuit 100, the node DN_HV is at a logic low voltage (voltage level of 0V) and the node DP_HV is at a logic high voltage (voltage level of VDDQ).

During the state of operation illustrated by FIG. 6, the gate of MP2D and MN2D are connected to the ground node GND, which causes MP2D to enter a strong 'ON' state and MN2D enter a strong 'OFF' state. At the same time, MP1D and MN1D are connected to the node DP_LV, which is at a voltage level of VDD. With the node DP_LV at a voltage level of VDD (which represents a deep-sleep operating mode of the level shifter), MP1D is in a weak 'OFF' state and MN1D is in a strong 'ON' state.

With respect to the cross branches in FIG. 6, the nodes NET_A, NET_B, and NET_D remain at a voltage level of VDDQ, and the node NET_C attains a logic low voltage (0V). This results into a strong 'ON' state for MP2L and a cut-off state for MN2L (based on both the nodes NET_A and NET_D attaining a voltage level of VDDQ) in the branch driving the node DP_HV, which drives the node DP_HV to a logic high voltage at voltage level of VDDQ. Additionally, the cross branch from the node NET_D to the gate of MP1L is cut off (based on both the nodes NET_A and NET_D attaining a voltage level of VDDQ) and MN1L is in a strong 'ON' state in the branch that drives DN_HV, which results in DN_HV attaining a logic low voltage (voltage level of 0V).

Figure 7:
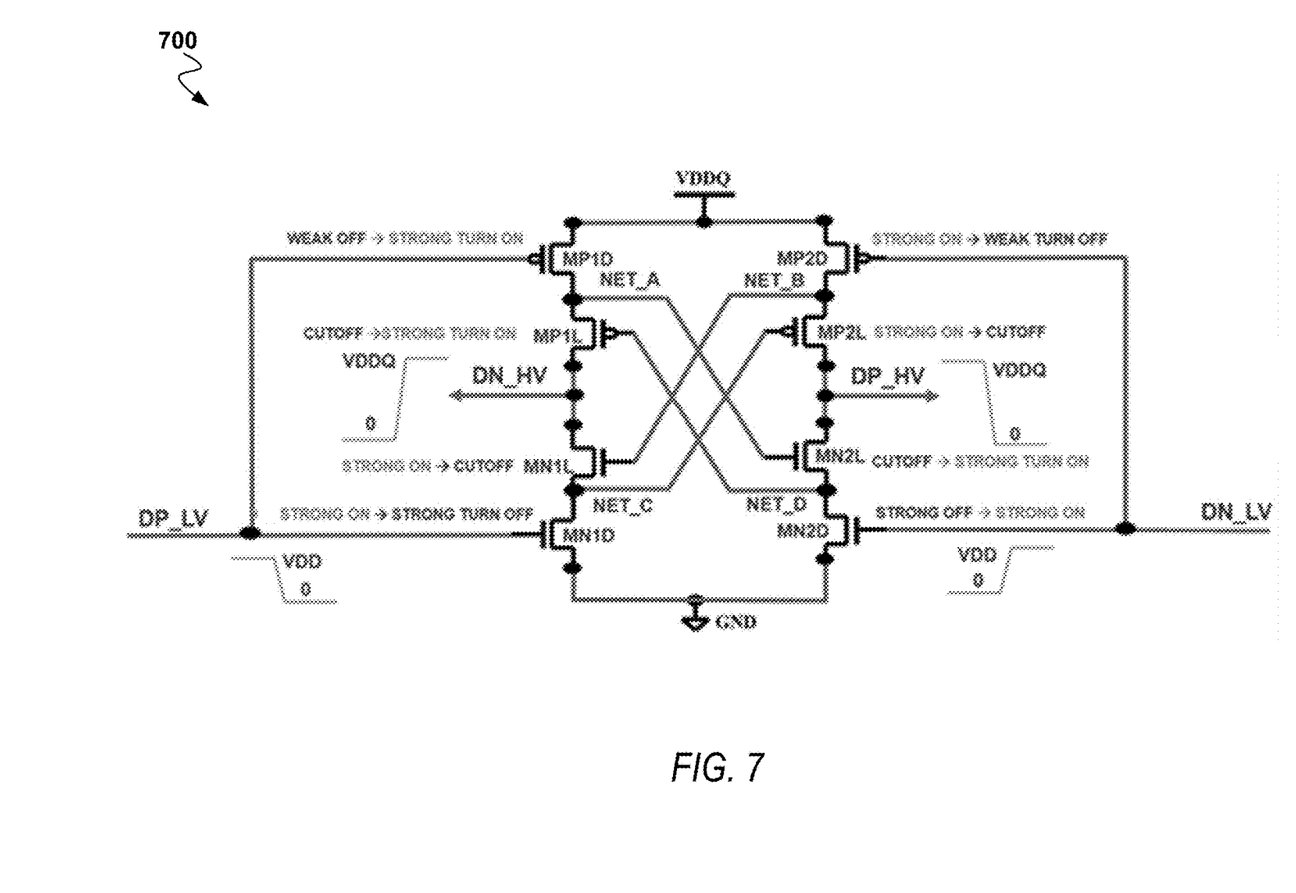

Referring now to FIG. 7, according to some embodiments, FIG. 7 illustrates the level shifter circuit 100-transitioning from a logic high input state (e.g., IN=VDD) to logic low input state (e.g., IN=0V). As input to the level shifter circuit 100, the node DP_LV of the level shifter circuit 100 switches from a logic high voltage (voltage of VDD) to a logic low voltage (voltage level of 0V) and the node DN_LV switches from a logic low voltage (voltage level of 0V) to a logic high voltage (voltage level of VDD). The nodes DP_LV and DN_LV receive these signals based on the input signal IN of the splitter circuit 200 switching from a logic high voltage (voltage level of VDD) to a logic low voltage (voltage level of 0V). As output to the level shifter circuit 100, the node DN_HV switches from a logic low voltage (voltage level of 0V) to a logic high voltage (voltage level of VDDQ), and the node DP_HV switches from a logic high voltage (voltage level of VDDQ) to a logic low voltage (voltage level of 0V).

During the state of operation illustrated by FIG. 7, MP1D switches from a weak 'OFF' state to a strong 'ON' state and MN1D switches from a strong 'ON' state to a strong 'OFF' state based on the node DP_LV switching from a logic high level signal (voltage level of VDD) to a logic low voltage (voltage level of 0V). MN2D switches from a strong 'OFF' state to a strong 'ON' state and MP2D switches from a strong 'ON' state to a weak 'OFF' state based on the node DN_LV switching from a logic low voltage (voltage level of 0V) to a logic high voltage (voltage level of VDD).

Since MN2L is cut-off initially, the node NET_D will fall quickly and this, in turn, would cause MP1L to switch from a cut-off state to a strong 'ON' state. Based on both MP1D and MP1L entering a strong 'ON' state and MN1D entering a strong 'OFF' state, the node DN_HV switches from a logic low voltage (0V) to a logic high voltage (VDDQ). Additionally, the gate voltage of MN1L (via the node NET_B) is at voltage level of VDDQ, which causes the cross branch from the node NET_C to the gate of MP2L to attain a voltage level of VDDQ and causes MP2L to enter a cut-off state. The strong 'ON' state of MP1D pulls the cross branch from the node NET_A to the gate of MN2L to a voltage level of VDDQ, which causes MN2L to enter the strong 'ON' state. Since both MN2D and MN2L enter a strong 'ON' state and MP2L enters a strong 'OFF' state, the node DP_HV switches from a logic high voltage (voltage level of VDDQ) to a logic low voltage (0V).

When level shifter is not transmitting high speed data, the core supply (e.g., VDD) of level shifter can be reduced below the threshold voltage of the level shifter input devices MN1D and MN2D to save the power consumption of the processor circuit operating at core supply (e.g., VDD).

Figure 8:
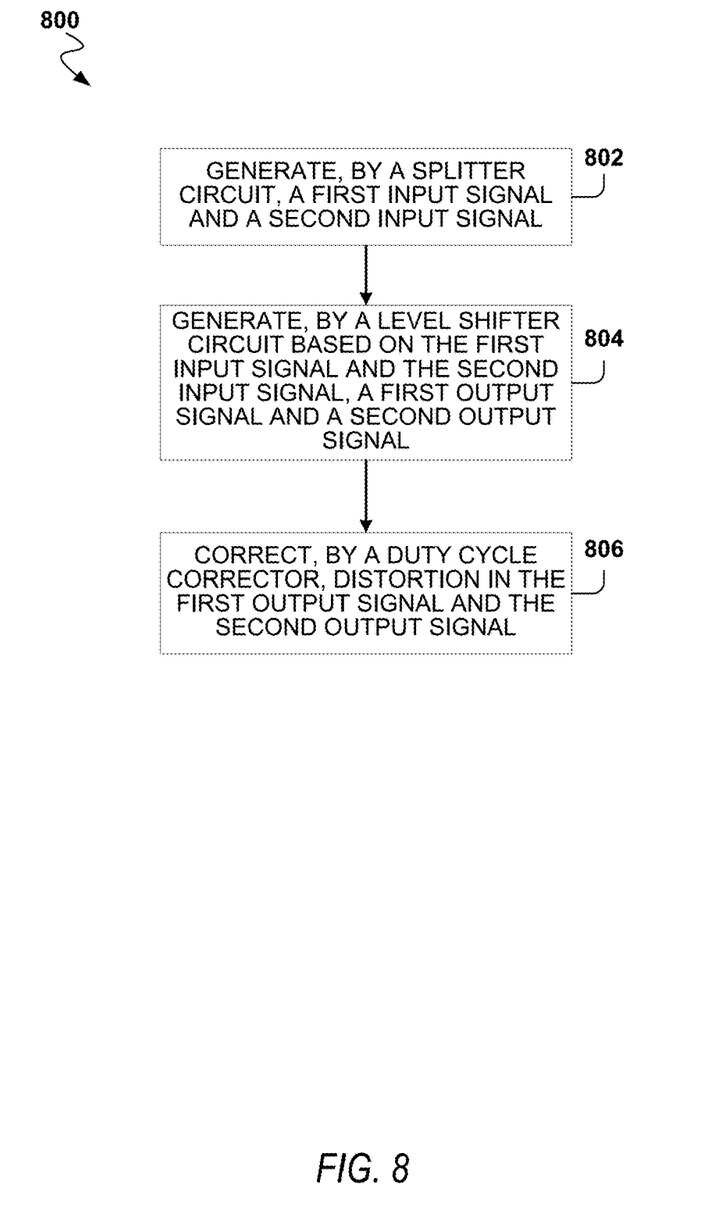
FIG. 8 is a flowchart illustrating an example method of a level shifter circuit, in accordance with some embodiments.

FIG. 8 is a flowchart illustrating an example method 800 of the level shifter circuit 100, in accordance with some embodiments. As shown, the method 800 begins at operation 802, where a splitter circuit (e.g., the splitter circuit 200) generates a first input signal to the level shifter circuit 100 (e.g., via the node DP_LV) based on an initial input signal (e.g., IN) at a first voltage (e.g., VDD) and a second input signal to the level shifter circuit 100 (e.g., via the node DN_LV) based on the initial input signal (e.g., IN). The second input signal to the level shifter circuit 100 (e.g., DN_LV) is a logical compliment of the first input signal to the level shifter circuit 100 (e.g., DP_LV).

The method 800 continues with operation 804, where the level shifter circuit 100 generates, based on the first input signal (e.g., via the node DN_LV) and the second input signal (e.g., via the node DP_LV), a first output signal at a second voltage (e.g., VDDQ) at a first output node (e.g., the node DN_HV) and a second output signal at a second output node (e.g., the node DP_HV). The second output signal (e.g., at a ground voltage) comprise a logical compliment of the first output signal (e.g., at I/O interface supply VDDQ).

The method 800 continues with operation 806, where a duty cycle correction circuit (e.g., the duty cycle corrector 300) corrects the duty cycle distortion in the first output signal (e.g., provided by the node DN_HV) and second output signal (e.g., provided by the node DP_HV) and generates the final output signals OUT_HV and OUTB_HV which are the logical compliment of each other.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
an input node to receive an input signal at a first voltage;
a first output node to provide a first output signal at a second voltage;
a second output node to provide a second output signal that is a logical compliment of the first output signal; and
a sub-circuit coupling the input node to the first output node and the second output node, the sub-circuit comprising a first arrangement of transistors and a second arrangement of transistors;
wherein the first arrangement of transistors comprises a first PMOS transistor coupled between a voltage supply node and a first cross-branch node, a second PMOS transistor coupled between the first cross-branch node and the first output node, a first NMOS transistor coupled between the first output node and a second cross-branch node, and a second NMOS transistor coupled between the second cross-branch node and a ground node;
wherein the second arrangement of transistors comprises a third PMOS transistor coupled between the voltage supply node and a third cross-branch node, a fourth PMOS transistor coupled between the third cross-branch node and the second output node, a third NMOS transistor coupled between the second output node and a fourth cross-branch node, and a fourth NMOS transistor coupled between the fourth cross-branch node and the ground node; and
wherein the first cross-branch node is coupled to a gate of the third NMOS transistor, the second cross-branch node is coupled to a gate of the fourth PMOS transistor, the third cross-branch node is coupled to a gate of the first NMOS transistor, and the fourth cross-branch node is coupled to a gate of the second PMOS transistor.

2. The circuit of claim 1, wherein the input signal comprises a core input signal.

3. The circuit of claim 1, further comprising a duty cycle correction circuit to correct duty cycle distortion in the first output signal to generate a first corrected output signal and to correct duty cycle distortion in the second output signal to generate a second corrected output signal, wherein the output signal is based on at least one of the first corrected output signal or the second corrected output signal.

4. The circuit of claim 1, wherein a gate of the first PMOS transistor and a gate of the second NMOS transistor receive a first input signal based on the input signal, a gate of the third PMOS transistor and a gate of the fourth NMOS transistor receive a second input signal based on the input signal, and the second input signal is a logical compliment of the first input signal.

5. The circuit of claim 4, further comprising a splitter circuit that generates the first input signal based on the input signal and that generates the second input signal based on the input signal.

6. A method comprising:
   generating, by a splitter circuit, a first input signal based on an input signal at a first voltage and a second input signal based on the input signal, wherein the second input signal is a logical compliment of the first input signal; and
   generating, by a level shifter circuit based on the first input signal and the second input signal, a first output signal at a second voltage at a first output node and a second output signal at a second output node, wherein the second output signal is a logical compliment of the first output signal;
   wherein the level shifter circuit comprises a first and a second arrangements of transistors coupled between a voltage supply node and a ground node;
   wherein the first arrangement of transistors comprises a first PMOS transistor coupled between the voltage supply node and a first cross-branch node, a second PMOS transistor coupled between the first cross-branch node and the first output node, a first NMOS transistor coupled between the first output node and a second cross-branch node, and a second NMOS transistor coupled between the second cross-branch node and the ground node;
   wherein the second arrangement of transistors comprises a third PMOS transistor coupled between the voltage supply node and a third cross-branch node, a fourth PMOS transistor coupled between the third cross-branch node and the second output node, a third NMOS transistor coupled between the second output node and a fourth cross-branch node, and a fourth NMOS transistor coupled between the fourth cross-branch node and the ground node; and
   wherein the first cross-branch node is coupled to a gate of the third NMOS transistor, the second cross-branch node is coupled to a gate of the fourth PMOS transistor, the third cross-branch node is coupled to a gate of the first NMOS transistor, and the fourth cross-branch node is coupled to a gate of the second PMOS transistor.

7. The method of claim 6, wherein the input signal comprises a core voltage input signal.

8. The method of claim 6, further comprising correcting, by a duty cycle correction circuit, duty cycle distortion in the first output signal and duty cycle distortion in the second output signal.

9. The method of claim 6, wherein a gate of the first PMOS transistor and a gate of the second NMOS transistor receive the first input signal, and a gate of the third PMOS transistor and a gate of the fourth NMOS transistor receive the second input signal based on the input signal.

10. The method of claim 6, wherein the second input signal is at the ground voltage.

11. The method of claim 6, further comprising:
    generating, by the splitter circuit, a third input signal based on a secondary input signal at a ground voltage and a fourth input signal at the first voltage based on the secondary input signal, wherein the fourth input signal is a logical compliment of the third input signal; and
    generating, by the level shifter circuit based on the third input signal and the fourth input signal, a third output signal at the ground voltage at the first output node and a fourth output signal at the second voltage at the second output node, wherein the fourth output signal is a logical compliment of the third output signal.

12. A circuit comprising:
    an input node to receive an input signal at a first voltage;
    a first output node to provide a first output signal at a second voltage;
    a second output node to provide a second output signal that is a logical compliment of the first output signal;
    a sub-circuit coupling the input node to the first output node and to the second output node, the sub-circuit comprising a first arrangement of transistors, a second arrangement of transistors, at least three cross-branches coupling the first arrangement of transistors to the second arrangement of transistors;
    wherein the first arrangement of transistors comprises a first PMOS transistor coupled between a voltage supply node and a first cross-branch node coupled to the second arrangement of transistors, a second PMOS transistor coupled to the first cross-branch node, a first NMOS transistor coupled to the second PMOS transistor, a second NMOS transistor coupled between the first NMOS transistor and a ground node; and
    wherein the second arrangement of transistors comprises a third PMOS transistor coupled between the voltage supply node and a second cross-branch node coupled to the first arrangement of transistors, a fourth PMOS transistor coupled to the second cross-branch node, a third NMOS transistor coupled to the fourth PMOS transistor, and a fourth NMOS transistor coupled between the third NMOS transistor and the ground node.

13. The circuit of claim 12, wherein the second PMOS transistor is coupled between the first cross-branch node and the first output node, the first NMOS transistor is coupled between the first output node and a third cross-branch node coupled to the second arrangement of transistors, and the second NMOS transistor is coupled between the third cross-branch node and the ground node.

14. The circuit of claim 13, wherein the fourth PMOS transistor is coupled between the second cross-branch node and the second output node, the third NMOS transistor is coupled between the second output node and a fourth cross-branch node coupled to the first arrangement of transistors, and the fourth NMOS transistor is coupled between the fourth cross-branch node and the ground node.

15. The circuit of claim 14, wherein the first cross-branch node is coupled to a gate of the third NMOS, and the third cross-branch node is coupled to a gate of the fourth PMOS transistor.

16. The circuit of claim 14, wherein the second cross-branch node is coupled to a gate of the first NMOS transistor, and the fourth cross-branch node is coupled to a gate of the second PMOS transistor.

* * * * *